United States Patent
Chang et al.

(10) Patent No.: US 10,533,245 B2
(45) Date of Patent: Jan. 14, 2020

(54) MASK ASSEMBLY, METHOD OF MANUFACTURING THEREOF, AND APPARATUS INCLUDING THE SAME

(71) Applicant: Samsung Display Co., Ltd., Yongin-si (KR)

(72) Inventors: Soonchul Chang, Yongin-si (KR); Seungyong Song, Yongin-si (KR); Sungsoon Im, Yongin-si (KR); Kyuhwan Hwang, Yongin-si (KR); Minho Moon, Yongin-si (KR); Youngmin Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 63 days.

(21) Appl. No.: 15/218,526

(22) Filed: Jul. 25, 2016

(65) Prior Publication Data

US 2017/0198383 A1    Jul. 13, 2017

(30) Foreign Application Priority Data

Jan. 12, 2016   (KR) .................. 10-2016-0003679

(51) Int. Cl.
| | | |
|---|---|---|
| C23C 14/04 | (2006.01) | |
| C23C 16/04 | (2006.01) | |
| B05C 21/00 | (2006.01) | |
| H01L 51/00 | (2006.01) | |
| C21D 8/02 | (2006.01) | |

(52) U.S. Cl.
CPC .......... *C23C 14/042* (2013.01); *B05C 21/005* (2013.01); *C23C 16/042* (2013.01); *H01L 51/0011* (2013.01); *C21D 8/0205* (2013.01)

(58) Field of Classification Search
None
See application file for complete search history.

(56) References Cited

U.S. PATENT DOCUMENTS

| | | | | |
|---|---|---|---|---|
| 6,229,255 B1* | 5/2001 | Kim | .................... | C21D 8/0205 313/402 |
| 2002/0025406 A1* | 2/2002 | Kitazume | ............. | C23C 14/042 428/136 |
| 2003/0221613 A1* | 12/2003 | Kang | ....................... | C25D 1/10 118/504 |

(Continued)

FOREIGN PATENT DOCUMENTS

| | | |
|---|---|---|
| CN | 101798670 | 8/2010 |
| CN | 102023474 | 4/2011 |

(Continued)

OTHER PUBLICATIONS

Standard Test Methods for Determining Average Grain Size; ASTM E 112-96 (Year: 2004).*

(Continued)

*Primary Examiner* — Binu Thomas
(74) *Attorney, Agent, or Firm* — H.C. Park & Associates, PLC (57) ABSTRACT

A mask assembly, and an apparatus including the same are provided. The mask assembly includes a mask sheet. The mask sheet includes a pattern portion having openings, and a welding portion connected to the pattern portion. The welding portion has a grain size different from a grain size of the pattern portion.

20 Claims, 6 Drawing Sheets

(56) References Cited

U.S. PATENT DOCUMENTS

| | | | |
|---|---|---|---|
| 2004/0115342 A1* | 6/2004 | Shigemura | H01L 51/0004 |
| | | | 101/112 |
| 2009/0297768 A1* | 12/2009 | Ko | B23K 31/02 |
| | | | 428/136 |
| 2010/0192856 A1 | 8/2010 | Sung et al. | |
| 2011/0067630 A1* | 3/2011 | Ko | C23C 14/042 |
| | | | 118/504 |
| 2012/0067858 A1 | 3/2012 | Kangastupa et al. | |
| 2012/0174862 A1* | 7/2012 | Lee | C23C 14/042 |
| | | | 118/504 |
| 2012/0234236 A1 | 9/2012 | Ko et al. | |
| 2014/0331925 A1* | 11/2014 | Han | C23C 14/042 |
| | | | 118/504 |
| 2016/0115580 A1* | 4/2016 | Mizumura | C23C 14/042 |
| | | | 118/720 |
| 2016/0145762 A1* | 5/2016 | Im | C25D 1/10 |
| | | | 118/504 |
| 2016/0322571 A1* | 11/2016 | Lee | C23C 16/042 |

FOREIGN PATENT DOCUMENTS

| | | |
|---|---|---|
| JP | 2005-174626 | 6/2005 |
| JP | 2015-10263 | 1/2015 |
| JP | 2015-10270 | 1/2015 |
| KR | 2002-0016599 | 3/2002 |

OTHER PUBLICATIONS

D.J. Tillack; Nickel alloys and stainless steels for elevated temperature service: weldability considerations; Sep. 1997 (Year: 1997).*

Choi et al.; High Hardness Nanocrystalline Invar Alloys Prepared from Fe—Ni Nanoparticles; www.mdpi.com/journal/metals Metals 2018, 8, 28; doi:10.3390/met8010028 (Year: 2018).*

Office Action dated Oct. 30, 2019, issued in CN Patent Application No. 201611127385.3.

* cited by examiner

< PRESENT EMBODIMENT >

<COMPARATIVE EMBODIMENT>

FAILURE IN WELDING

MASK ASSEMBLY, METHOD OF MANUFACTURING THEREOF, AND APPARATUS INCLUDING THE SAME

CROSS-REFERENCE TO RELATED APPLICATION

This application claims priority from and the benefit of Korean Patent Application No. 10-2016-0003679, filed on Jan. 12, 2016, which is hereby incorporated by reference for all purposes as if fully set forth herein.

BACKGROUND

Field

Exemplary embodiments relate to a mask assembly, a method of manufacturing thereof, and an apparatus including the same.

Discussion of the Background

Electronic devices, such as mobile phones, notebook computers, personal digital assistants, tablets, etc, are widely used. These devices typically include a display device to provide users with visual information, such as an image or video information, in order to support various functions. Recently, as components for driving such display device have become miniaturized, use of display devices in electronic devices is gradually increasing.

A mask assembly may be used to manufacture the display device. The mask assembly includes a mask frame and a mask sheet. A welding efficiency between the mask sheet and the mask frame may affect the resolution of the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a mask assembly and an apparatus including the same for manufacturing a display device precisely.

Additional aspects will be set forth in the detailed description which follows and, in part, will be apparent from the disclosure, or may be learned by practice of the inventive concept.

An exemplary embodiment discloses a mask assembly including a mask sheet, the mask sheet including: a pattern portion having openings; and a welding portion connected to the pattern portion, the welding portion having a particle size different from a particle size of the pattern portion.

An exemplary embodiment discloses a method of manufacturing a mask assembly including manufacturing a mask sheet, and mounting the mask sheet on the mask frame. The manufacturing of the mask sheet includes: forming openings in a first portion of a base member to form a pattern portion; and thermally treating a second portion of the base member to form a welding portion. The pattern portion and the welding portion are provided as the mask sheet.

An exemplary embodiment discloses an apparatus for manufacturing a display device including a mask assembly, and a deposition source facing the mask assembly and providing a deposition material via the mask assembly. The mask assembly includes a mask sheet including: a pattern portion having openings; and a welding portion connected to the pattern portion, the welding portion having a particle size different from a particle size of the pattern portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
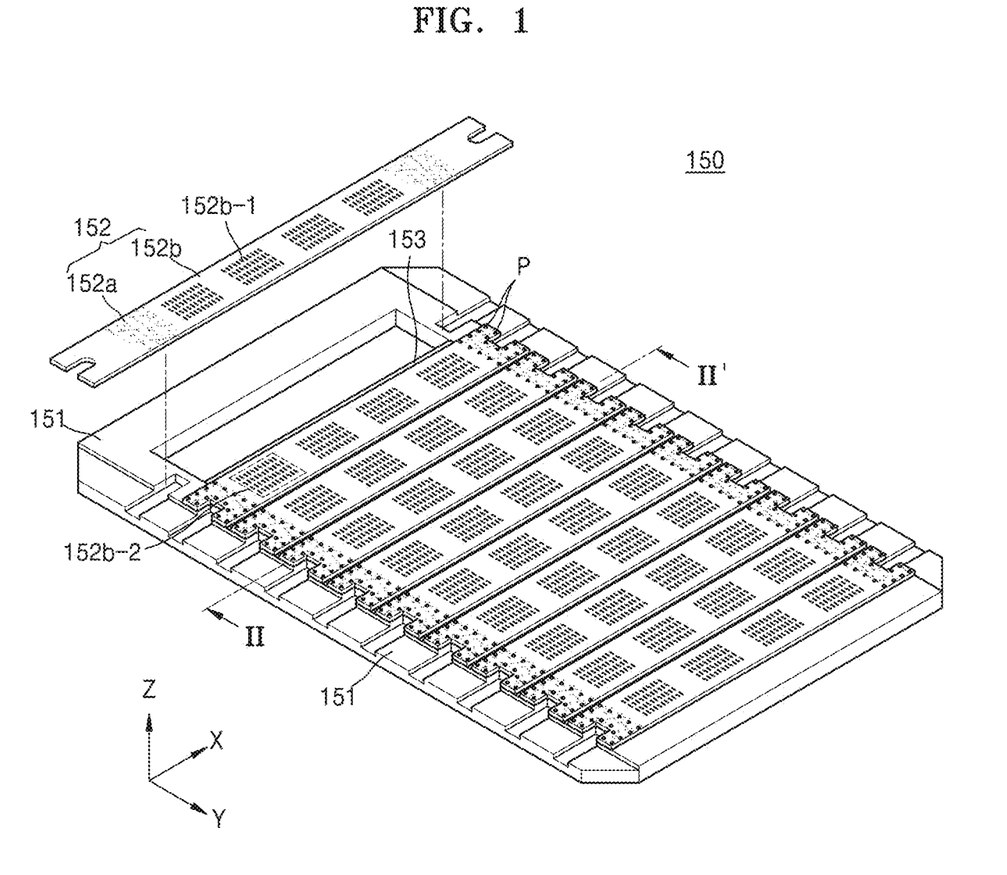
FIG. 1 is a perspective view of a mask assembly according to an exemplary embodiment.
Figure 2:
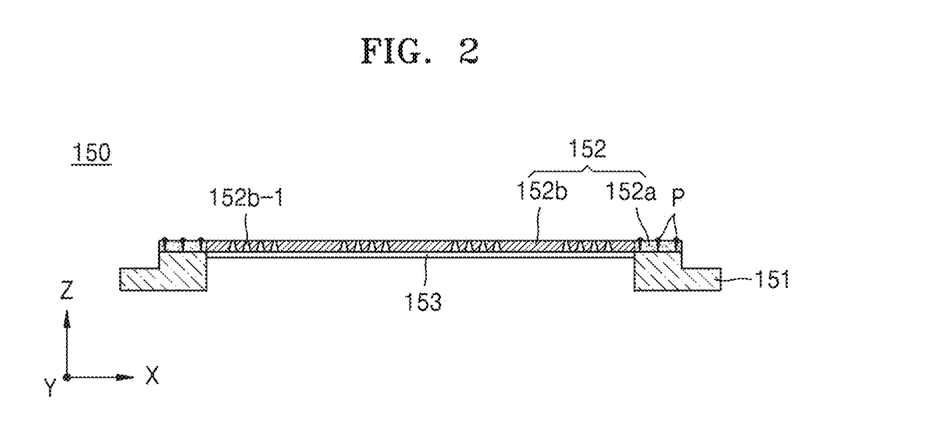
FIG. 2 is a cross-sectional view along line II-II' of FIG. 1.

FIG. 1 is a perspective view of a mask assembly 150 according to an exemplary embodiment. FIG. 2 is a cross-sectional view along line II-II' of FIG. 1.

Referring to FIGS. 1 to 4, the mask assembly 150 may include a mask frame 151, a mask sheet 152, and a support member 153.

The mask frame 151 may have a frame shape. The mask frame 151 may include various frame portions being connected to one another. For example, first and second frame portions extend in an X direction, third and fourth frame portions being connected to the first and second frame portions extend in a Y direction, and the first through fourth frame portions may define an opening at center of the mask frame 151. In another example, the mask frame 151 may have a lattice shape defining a plurality of openings.

Mask sheets 152 may be arranged in a Y direction, and each mask sheet 152 may extend in the X direction. The mask sheets 152 may cover the opening of the mask frame 151. The mask sheet 152 may be mounted on the mask frame 151. The mask sheet 152 may be welded to the mask frame 151. For example, the mask sheet 152 may be pulled in a lengthwise direction of the mask sheet 152 and be fixed to the mask frame 151 via welding.

The mask sheet 152 includes a pattern portion 152*b* having openings 152*b*-1, and a welding portion 152*a* connected to the pattern portion 152*b*.

The mask sheet 152 may be formed of a nickel-iron alloy. In this case, the nickel content may be in a range of about 30 wt % to about 50 wt % of the weight of the mask sheet 152.

The openings 152*b*-1 may be formed in the pattern portion 152*b*. In an exemplary embodiment, the openings 152*b*-1 form a plurality of groups, and the groups are spaced apart from one another in the X direction. Each group may be defined as a pattern region 152*b*-2. The pattern region 152*b*-2 may correspond to a display region of a substrate (see 21 in FIG. 5) on which a deposition material is to be deposited. The openings 152*b*-1 formed in the pattern region 152*b*-2 may be spaced apart from one another at regular intervals, and may form a particular pattern.

The welding portion 152*a* may be connected to the pattern portion 152*b*. For example, the welding portion 152*a* may extend from the pattern portion 152*b* and be integrated with the pattern portion 152*b*. The welding portion 152*a* may be disposed on the mask frame 151, and welding points P may be formed in the welding portion 152*a* for mounting the mask sheet 152 on the mask frame 151.

The welding portion 152*a* may be included in the mask sheet 152 according to various methods. For example, two welding portions 152*a* may be disposed at the ends of the pattern portion 152*b*, respectively, and may be connected to the pattern portion 152*b*. The welding portion 152*a* may be formed to have a rectangular shape, a stripe shape, or a line shape in the mask sheet 152.

The welding points P may be spaced apart from one another in the welding portion 152*a*. The welding portion 152*a* may be formed to have a certain area such that the welding points P are disposed within the welding portion 152*a*. The welding portion 152*a* may be formed to have a shape of a dot, a polygon, a circle, or the like in the mask sheet 152. A single welding point may be formed in the welding portion 152*a*. Some of the welding points P may be formed out of the welding portion 152*a*.

The pattern portion 152*b* and the welding portion 152*a* may be formed of the same material. In this case, a grain size (hereinafter referred to interchangeably as "particle size") of the pattern portion 152*b* may be different from that of the welding portion 152*a*. The particle size of the pattern portion 152*b* may be smaller than that of the welding portion 152*a*. For example, the magnitude of the particle diameters of the pattern portion 152*b* is in nanometers, whereas the magnitude of the particle diameters of the welding portion 152*a* may be in micrometers. This difference in particle size may induce heat to be more efficiently transferred to the welding points P, and a welding efficiency between the mask frame 151 and the welding portion 152a may improve. Further, the heat may be effectively released out of the welding portion 152a. Therefore, the welding portion 152a may be prevented from melting when the welding points P are formed.

Surface roughness of the pattern portion 152b may be different from surface roughness of the welding portion 152a. For example, the surface roughness of the pattern portion 152b may be less than the surface roughness of the welding portion 152a. In this case, heat may be efficiently transferred within the welding portion 152a and may be released out of the welding portion 152a. Therefore, the welding portion 152a may be prevented from melting while the welding points P are formed.

The support member 153 may be mounted on the mask frame 151. The support member 153 may be mounted parallel to one side of the mask frame 151. The support member 153 may be disposed between the mask sheets 152 or may be disposed to have a certain angle with the lengthwise direction of the mask sheet 152. The support member 153 may support the mask sheets 152 to thereby prevent the mask sheets 152 from sagging due to their weights or the like while the mask sheets 152 are being thermally deformed.

Figure 3:
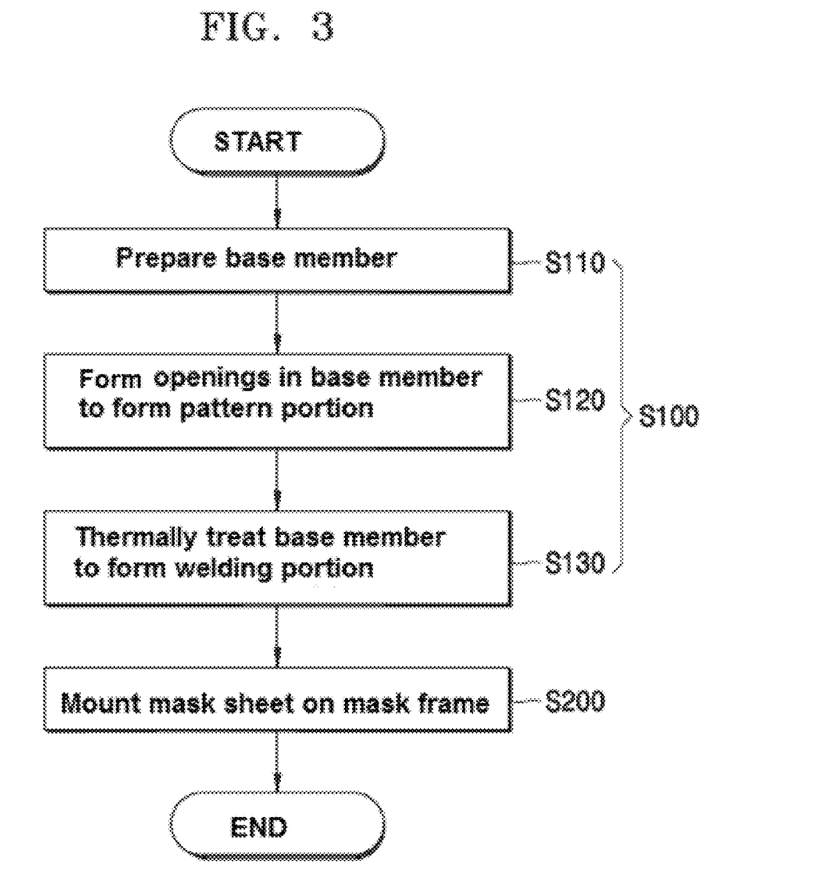
FIG. 3 is a flow chart illustrating a method of manufacturing a mask assembly according to an exemplary embodiment.
Figure 4:
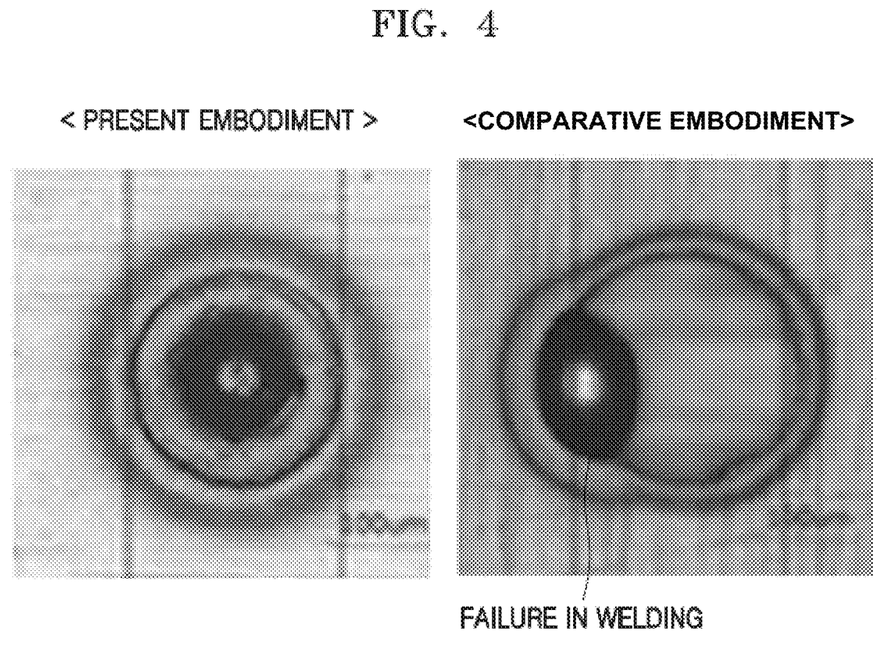
FIG. 4 is a plan view showing a welding result of the mask sheet according to a present embodiment and a welding result of a mask sheet according to a comparative embodiment.

FIG. 3 is a flow chart illustrating a method of manufacturing a mask assembly according to an exemplary embodiment. FIG. 4 is a plan view showing a welding result of the mask sheet 152 according to a present exemplary embodiment and a welding result of a mask sheet according to a comparative embodiment of the conventional art.

Referring to FIGS. 1 and 3, at step S100, a mask sheet 152, including a welding portion 152a and a pattern portion 152b, is manufactured. Step S100 includes S110, S120, and S130.

At step S110, a base member (not shown) may be prepared. The base member may be manufactured according to various methods.

According to an exemplary embodiment, a base member formed of an iron-nickel alloy may be rolled to reduce a thickness thereof. In this case, particles that form the base member may be arranged parallel to the rolling direction.

According to an exemplary embodiment, the base member may be formed via electroforming plating. A plate-shaped base member may be manufactured via electroforming plating. In an exemplary embodiment, openings 152b-1 are formed via electroforming plating. In an exemplary embodiment, the openings 152b-1 are formed after electroforming plating. For convenience of description, it is assumed that the openings 152b-1 are formed after the base member is manufactured.

At step S120, the openings 152b-1 may be formed in the base member to form a pattern portion 152b. For example, the openings 152b-1 may be formed via laser drilling method of irradiating the base member with laser, or via etching method of spraying an etchant or dipping the base member in an etchant. For instance, the base member may be coated with a photoresist to form a pattern of the openings 152b-1.

At step S130, at least a portion of the base member may be thermally treated to form a welding portion 152a. Step S130 may be performed before or after the openings 152b-1 are formed. The welding portion 152a and the pattern portion 152b are provided as the mask sheet 152.

The portion of the base member may be thermally treated within a range of about 350° C. to the melting point of the base member. The melting point of the base member may depend on the degree of iron or nickel content. For example, the melting point of the base member may be about 1440° C. For instance, the portion of the base member may be thermally treated within a range of about 350° C. to about 750° C.

To thermally treat the base member, the base member may be inserted into a chamber (not shown), and then the chamber may be supplied with an inert gas, such as helium, argon, or nitrogen. Such a thermal treatment should be performed under the circumstance where oxygen does not exist within the chamber or oxygen is not generated during a thermal treatment. Otherwise, an oxide layer may be formed on the exterior of the base member due to oxygen, and thus, a welding efficiency when the base member is welded to a mask frame 151 may be reduced due to the oxide layer.

As such, while a gas is being supplied to the chamber, a laser or the like may be applied to the base member to heat the base member, therefore realizing a thermal treatment of a surface of the base member. The gas within the chamber may be discharged via a pump or the like.

The thermal treatment may increase a particle size of the base member. For example, the magnitude of the particle diameters of the base member may be in nanometers before the thermal treatment, and the magnitude of the particle diameters of the welding portion 152a may be in micrometers after the thermal treatment.

When the base member is thermally treated as described above, a particle crystal structure of the portion of the base member may change. In detail, when the base member is formed of an iron-nickel alloy, a particle crystal structure of the base member may include a body centered cubic (BCC) structure and a face centered cubic (FCC) structure. When the base member is thermally treated as described above, the number of particles having BCC structures and the number of particles having FCC structures may vary. For example, when the base member is thermally treated as described above, the number of particles having the BCC structures may decrease. On the other hand, the number of particles having the FCC structures may increase. In other words, particles having the BCC structures within the base member may turn into particles having the FCC structures via a phase change. In this case, since the heat conductivity of the particles having the FCC structures is greater than the heat conductivity of the particles having the BCC structures, the heat conductivity of the welding portion 152a may be greater than the heat conductivity of the pattern portion 152b. The number of particles having the FCC structures among particles of the welding portion 152a may be greater than the number of particles having the FCC structures among particles of the pattern portion 152b. For example, the majority of the particles of the welding portion 152a may have the FCC structures.

When the base member is thermally treated as described above, the particles that constitute the welding portion 152a may be enlarged in various directions from a state of being formed elongated in the rolling direction. In this case, the particle size of the welding portion 152a may be increased to be greater than that of the pattern portion 152b.

At step S200, the mask sheet 152 may be mounted on the mask frame 151. The welding portion 152a may be welded to the mask frame 151. For example, the mask sheet 152 is pulled in a lengthwise direction of the mask sheet 152 and mounted on the mask frame 151 by welding the welding points P. The welding portion 152a may be disposed on the mask frame 151.

It is assumed that the welding portion 152a is not thermally treated. The heat conductivity of the welding portion 152a may be relatively low according to the particle crystal structure thereof. This may lead to improper heat transfer when irradiating laser or the like for welding the welding portion 152a, resulting in possible melting of the welding portion 152a (see FIG. 4) and an improper welding connection to the mask frame 151. Further, the mask sheet 152 may be detached from the mask frame under a high temperature circumstance.

According to an exemplary embodiment, the welding portion 152a is thermally treated. The welding portion 152a treated thermally may have a high heat conductivity. For example, when the welding portion 152a has many particles having FCC structures, the welding portion 152a may have a greater heat conductivity than the other portions of the mask sheet 152. In this case, heat applied during welding may be rapidly and smoothly transferred in a thickness direction of the mask sheet 152. For instance, even when low heat energy is applied, the mask sheet 152 and the mask frame 151 may be smoothly welded to each other. Moreover, the welding portion 152a may be prevented from melting since heat energy fails to be transferred and is thus accumulated within the welding portion 152a. Therefore, the mask sheet 152 may be securely mounted on the mask frame 151, thereby increasing the productivity of products and minimizing a defect rate.

Figure 5:
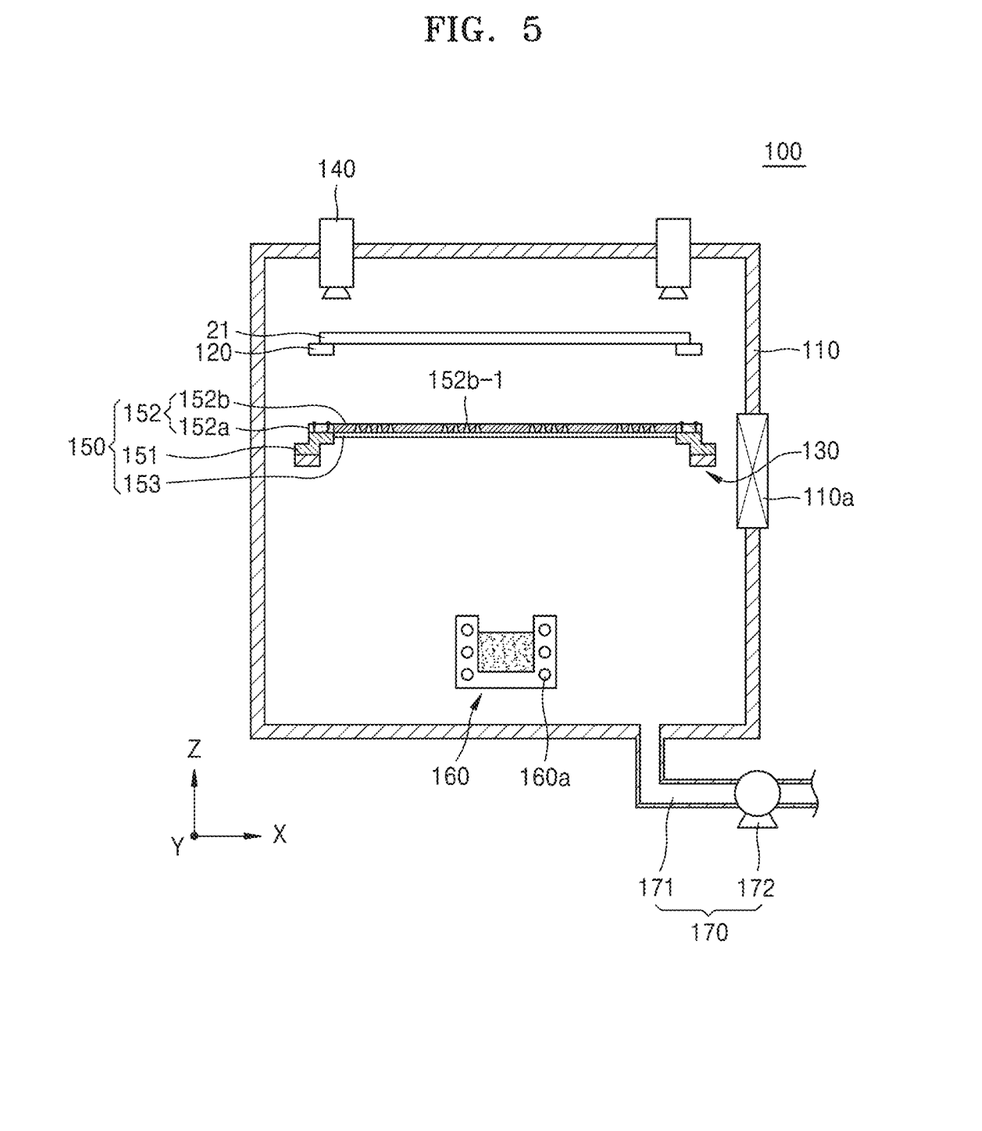
FIG. 5 is a schematic cross-sectional view of an apparatus for manufacturing a display device according to an exemplary embodiment.

FIG. 5 is a schematic cross-sectional view of an apparatus 100 for manufacturing a display device according to an exemplary embodiment.

Referring to FIG. 5, the apparatus 100 may include a chamber 110, a mask assembly 150, a first support 120, a second support 130, a deposition source 160, a vision unit 140, and a pressure adjuster 170.

The chamber 110 may have a space therein, and a portion of the chamber 10 may be formed to be open. A gate valve 110a may be mounted on the open portion of the chamber 110 to open or close the open portion.

The mask assembly 150 may include a mask frame 151, a mask sheet 152, and a support member 153. The mask sheet 152 may include a pattern portion 152b in which openings 152b-1 are formed as described above, and a welding portion 152a connected to the pattern portion 152b. The mask frame 151, the mask sheet 152, and the support member 153 are the same as or similar to that described above, and thus, a detailed description thereof is omitted herein.

A substrate 21 may be seated on the first support 120. The first support 120 may be fixed within the chamber 110. According to another exemplary embodiment, the first support 120 may be movably disposed within the chamber 110. In this case, the first support 120 may be formed in the shape of a shuttle or the like.

The mask frame 151 may be seated on the second support 130. The second support 130 may be fixed within the chamber 110. The second support 130 may adjust relative locations between the substrate 21 and the mask assembly 150 by changing the location of the mask assembly 150.

The deposition source 160 may face the mask assembly 150. The deposition source 160 may be fixed within the chamber 110. According to another exemplary embodiment, the deposition source 160 may be movably disposed within the chamber 110.

A deposition material may be accommodated within the deposition source 160. A heater 160a, which heats the deposition material, may be disposed within the deposition source 160.

The vision unit 140 may be mounted on the chamber 110 to photograph the locations of the substrate 21 and the mask assembly 150. The vision unit 140 may transmit captured images to a controller (not shown). The controller may align the substrate 21 and the mask assembly 150 by adjusting the second support 130, based on the captured images.

The pressure adjuster 170 may be connected to the chamber 110 to discharge gas from the chamber 110 to the outside. The pressure adjuster 170 may include a connection pipe 171 connected to the chamber 110, and a pressure adjusting pump 172 provided on the connection pipe 171. The pressure adjustment pump 172 may maintain the internal pressure of the chamber 110 in an air pressure or a vacuum state.

For manufacturing a display device, the mask assembly 150 and the substrate 21 may be inserted into the chamber 110. The mask assembly 150 and the substrate 21 may be introduced into the chamber 110 via a robot arm separately provided outside the chamber 110, and may be seated on the first support 120 and the second support 130, respectively. Thereafter, the substrate 21 and the mask assembly 150 may be aligned based on an image captured by the vision unit 140.

When the heater 160a operates and thus, the deposition material is vaporized or sublimated, the vaporized or sublimated deposition material may be deposited on the substrate 21 via the mask assembly 150. The pressure adjustment pump 172 may operate to discharge the deposition material from the chamber 110.

The heated deposition material may heat the mask assembly 150. At this time, the heat applied to the mask sheet 152 and the mask frame 151 may deform the mask sheet 152. According to the exemplary embodiment, the mask sheet 152 is firmly fixed to the mask frame 151, and the deposition material may be deposited on the substrate 21 to have a designed pattern.

Figure 6:
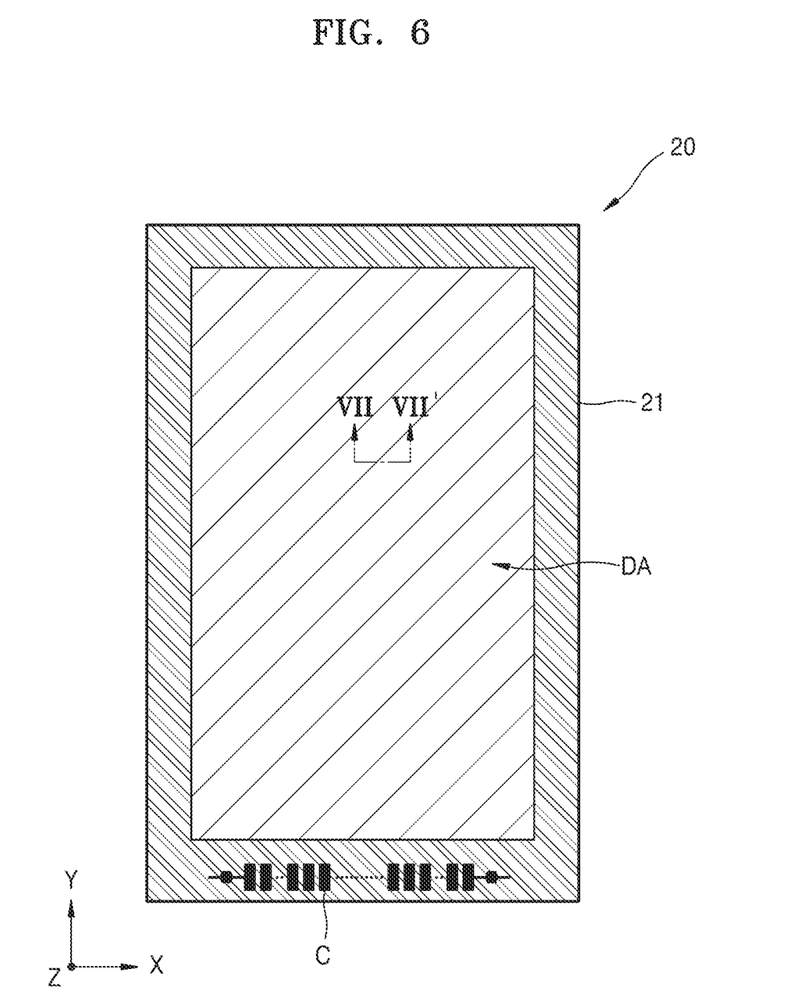
FIG. 6 is a plan view of a display device manufactured by the apparatus of FIG. 5.
Figure 7:
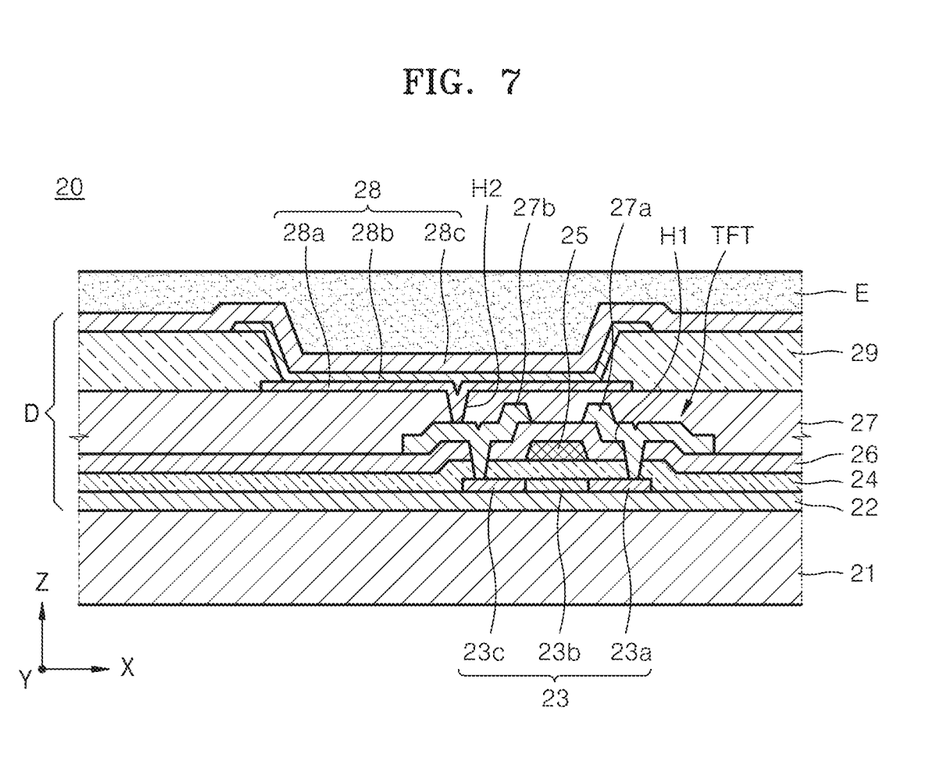
FIG. 7 is a cross-sectional view taken along line VII-VII' of FIG. 6.

FIG. 6 is a plan view of a display device 10 manufactured by the apparatus 100 of FIG. 5. FIG. 7 is a cross-sectional view taken along line VII-VII' of FIG. 6.

Referring to FIGS. 6 and 7, the display device 20 may include a display region DA and a non-display region around the display region DA, on the substrate 21. A light-emission unit D may be disposed in the display region DA, and power wiring (not shown) or the like may be disposed in the non-display region. A pad unit C may be disposed in the non-display region.

The display device 20 may include the substrate 21, the light-emission unit D, and a thin-film encapsulation layer E formed on an upper surface of the light-emission unit D. The substrate 21 may be formed of a plastic material, glass material, or a metal material, such as, steel use stainless (SUS) or titanium (Ti). The substrate 21 may be formed of polyimide (PI).

The light-emission unit D may be disposed on the substrate 21. The light-emission unit D may include a thin film transistor TFT, a passivation layer 27 covering the thin film transistor TFT, and an organic light-emitting diode (OLED) 28 formed on the passivation layer 27.

A buffer layer 22 formed of an organic compound and/or an inorganic compound is disposed on an upper surface of the substrate 21. The buffer layer 22 may be formed of silicon oxide ($SiO_x$) ($x≥1$) or silicon nitride ($SiN_x$) ($x≥1$).

An active layer 23 is disposed on the buffer layer 22 and is buried by a gate insulating layer 24. The active layer 23 includes a source region 23a, a drain region 23c, and a channel region 23b therebetween.

The active layer 23 may be formed to include various materials. For example, the active layer 23 may include an inorganic semiconductor material, such as amorphous silicon or crystalline silicon. As another example, the active layer 23 may include an oxide semiconductor. As another example, the active layer 23 may include an organic semiconductor material. However, for convenience of description, a case where the active layer 23 is formed of amorphous silicon will now be described in detail.

The active layer 23 may be formed by forming an amorphous silicon layer on the buffer layer 22, crystallizing the amorphous silicon layer to form a polycrystalline silicon layer, and patterning the polycrystalline silicon layer. The source region 23a and the drain region 23b of the active layer 23 are doped with impurities according to a TFT type, such as a driving TFT or a switching TFT.

A gate electrode 25 and an interlayer insulating layer 26, which buries the gate electrode 25, are disposed on an upper surface of the gate insulating layer 24.

A contact hole H1 is formed in the interlayer insulating layer 26 and the gate insulating layer 24, and a source electrode 27a and a drain electrode 27b are then formed on the interlayer insulating layer 26 such that the source electrode 27a and the drain electrode 27b contact the source region 23a and the drain region 23b, respectively.

The passivation layer 27 is disposed on the thin film transistor TFT formed as described above, and a pixel electrode 28a of the OLED 28 is formed on the passivation layer 27. The pixel electrode 28a contacts the drain electrode 27b of the thin-film transistor TFT through a via hole H2 formed in the passivation layer 27. The passivation layer 27 may be formed of an inorganic material and/or an organic material and as a single layer or multiple layers. The passivation layer 27 may be formed as a planarization layer such that an upper surface thereof is flat regardless of the unevenness of a lower layer under the passivation layer 27. Alternatively, the passivation layer 27 may be formed to be uneven according to the unevenness of the lower layer. The passivation layer 27 may be formed of a transparent insulator so that a resonance effect is achieved.

A pixel-defining layer 29 covers the pixel electrode 28a and the passivation layer 27. The pixel-defining layer 29 has an opening which exposes the pixel electrode 28a. The pixel-defining layer 29 may be formed of an organic material and/or an inorganic material.

The intermediate layer 28b and the opposite electrode 28c are disposed on the pixel electrode 28a.

The pixel electrode 28a may function as an anode, and the opposite electrode 28c may function as a cathode. Alternatively, the pixel electrode 28a may function as a cathode, and the opposite electrode 28c may function as an anode.

The pixel electrode 28a and the opposite electrode 28c are separated from each other by the intermediate layer 28b, and respectively apply voltages of opposite polarities to the intermediate layer 28b to induce light emission.

The intermediate layer 28b may include an organic emission layer. The intermediate layer 28b may further include at least one of a hole injection layer (HIL), a hole transport layer (HTL), an electron transport layer (ETL), and an electron injection layer (EIL). The present invention is not limited thereto, and the intermediate layer 28b may further include various other functional layers (not shown).

The intermediate layer 28b may be formed by the apparatus described with reference to FIG. 5. The mask sheet (see 152 in FIG. 5) may be firmly fixed to the mask frame (see 151 in FIG. 5), and then the deposition material may be deposited on the pixel electrode 28a to form the intermediate layer 28b. Accordingly, the intermediate layer 28b may be formed at an accurate location and may have a precise pattern even when the deposition process is repeatedly performed.

One unit pixel includes a plurality of sub-pixels, and the plurality of sub-pixels may emit light of various colors. For example, the unit pixel may include a plurality of sub-pixels which respectively emit red light, green light, and blue light, or a plurality of sub-pixels which respectively emit red light, green light, blue light, and white light.

The thin-film encapsulation layer E may include a plurality of inorganic layers or include an inorganic layer and an organic layer.

The organic layer of the thin-film encapsulation layer E is formed of a polymer and may be a single layer or a layer stack formed of polyethylene terephthalate (PET), polyimide, polycarbonate (PC), epoxy, polyethylene, or polyacrylate. The organic layer may be formed of polyacrylate. In detail, the organic layer may include a result of polymerizing a monomer composition including a diacrylate-based monomer and a triacrylate-based monomer. The monomer composition may further include monoacrylate-based monomer. The monomer composition may further include a well-known photoinitiator such as trimethyl benzoyl diphenyl phosphine oxide (TPO), but the present invention is not limited thereto.

The inorganic layer of the thin-film encapsulation layer E may be a single layer or a layer stack including metal oxide or metal nitride. In detail, the inorganic layer may include $SiN_x$, $Al_2O_3$, $SiO_2$, or $TiO_2$.

An uppermost layer exposed to the outside in the thin-film encapsulation layer E may be formed of an inorganic layer to prevent infiltration of moisture to the OLED 28.

The thin-film encapsulation layer E may include at least one sandwich structure in which at least one organic layer is interposed between at least two inorganic layers. Alternatively, the thin-film encapsulation layer E may include at least one sandwich structure in which at least one inorganic layer is interposed between at least two organic layers. Alternatively, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may include a first inorganic layer, a first organic layer, and a second inorganic layer sequentially formed starting from an upper portion of the OLED 28.

Alternatively, the thin-film encapsulation layer E may include a first inorganic layer, a first organic layer, a second inorganic layer, a second organic layer, and a third inorganic layer sequentially formed starting from the upper portion of the OLED 28.

Alternatively, the thin-film encapsulation layer E may include a first inorganic layer, a first organic layer, a second inorganic layer, a second organic layer, a third inorganic layer, a third organic layer, and a fourth inorganic layer sequentially formed starting from the upper portion of the OLED 28.

A halogenated metal layer including lithium fluoride (LiF) may be further included between the OLED 28 and the first inorganic layer. The halogenated metal layer may prevent the OLED 28 from being damaged when the first inorganic layer is formed by sputtering.

The first organic layer may have a smaller area than the second inorganic layer, and the second organic layer may also have a smaller area than the third inorganic layer.

According to exemplary embodiments, a mask sheet may be firmly fixed to a mask frame by thermally treating a portion of the mask sheet. A deposition material may be deposited onto a substrate precisely. Therefore, the productivity of products may be increased and a defect rate may be minimized.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A mask assembly comprising a mask sheet, the mask sheet comprising:
a pattern portion comprising at least one opening; and
a welding portion connected to, and extending laterally from, the pattern portion to form a single plate together with the pattern portion, the entire welding portion being formed of a same material as the pattern portion,
wherein the welding portion has a first area in which at least one welding point is formed and a second area adjacent to the first area, the first area and the second area having a grain size different from a grain size of the pattern portion.

2. The mask assembly of claim 1, wherein the grain size of the pattern portion is smaller than the grain size of the welding portion.

3. The mask assembly of claim 1, wherein the welding portion comprises the at least one welding point.

4. The mask assembly of claim 1, wherein surface roughness of the pattern portion is less than surface roughness of the welding portion.

5. The mask assembly of claim 1, wherein a magnitude of diameters of the grains of the pattern portion is in nanometers, and a magnitude of diameters of the grains of the welding portion is in micrometers.

6. The mask assembly of claim 1, wherein the mask sheet has a nickel content in a range of about 30 wt % to about 50 wt %.

7. The mask assembly of claim 1, wherein a particle crystal structure of the mask sheet comprises a body centered cubic structure and a face centered cubic structure.

8. The mask assembly of claim 7, wherein the number of particles each having the face centered cubic structure among particles of the welding portion is greater than the number of particles each having the face centered cubic structure among particles of the pattern portion.

9. The mask assembly of claim 1, further comprising a mask frame,
wherein the first area of the welding portion is welded on the mask frame through the at least one welding point to mount the mask sheet on the mask frame.

10. The mask assembly of claim 9, wherein the welding portion is disposed on the mask frame.

11. An apparatus for manufacturing a display device, the apparatus comprising:
a mask assembly; and
a deposition source facing the mask assembly and providing a deposition material via the mask assembly,
wherein the mask assembly comprises a mask sheet comprising:
a pattern portion comprising at least opening; and
a welding portion connected to, and extending laterally from, the pattern portion to form a single plate together with the pattern portion, the entire welding portion being formed of a same material as the pattern portion, and
wherein the welding portion has a first area in which at least one welding point is formed and a second area adjacent to the first area, the first area and the second area having a grain size different from a grain size of the pattern portion.

12. The apparatus of claim 11, wherein the grain size of the pattern portion is smaller than the grain size of the welding portion.

13. The apparatus of claim 11, wherein the welding portion comprises the at least one welding point.

14. The apparatus of claim 11, wherein surface roughness of the pattern portion is less than surface roughness of the welding portion.

15. The apparatus of claim 11, wherein a magnitude of diameters of the grains of the pattern portion is in nanometers, and a magnitude of diameters of the grains of the welding portion is in micrometers.

16. The apparatus of claim 11, wherein the mask sheet has a nickel content in a range of about 30 wt % to about 50 wt %.

17. The apparatus of claim 11, wherein a particle crystal structure of the mask sheet comprises a body centered cubic structure and a face centered cubic structure.

18. The apparatus of claim 17, wherein the number of particles each having the face centered cubic structure among particles of the welding portion is greater than the number of particles each having the face centered cubic structure among particles of the pattern portion.

19. The apparatus of claim 11, wherein:
the mask assembly further comprises a mask frame; and
the first area of the welding portion is welded to the mask frame through the welding points to mount the mask sheet on the mask frame.

20. The apparatus of claim 19, wherein the welding portion is disposed on the mask frame.

* * * * *